(12) United States Patent
Kawasaki

(10) Patent No.: US 10,784,648 B2
(45) Date of Patent: Sep. 22, 2020

(54) SEMICONDUCTOR LASER WITH WAVEGUIDE FLANKED BY CONDUCTIVE LAYERS

(71) Applicant: Mitsubishi Electric Corporation, Tokyo (JP)

(72) Inventor: Kazushige Kawasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/485,425

(22) PCT Filed: May 29, 2017

(86) PCT No.: PCT/JP2017/019908
§ 371 (c)(1),
(2) Date: Aug. 12, 2019

(87) PCT Pub. No.: WO2018/220674
PCT Pub. Date: Dec. 6, 2018

(65) Prior Publication Data
US 2020/0091675 A1 Mar. 19, 2020

(51) Int. Cl.
*H01S 5/026* (2006.01)
*G02B 6/12* (2006.01)
(Continued)

(52) U.S. Cl.
CPC .......... *H01S 5/026* (2013.01); *G02B 6/12004* (2013.01); *G02B 6/132* (2013.01);
(Continued)

(58) Field of Classification Search
CPC ...... H01S 5/026; H01S 5/4087; H01S 5/4012; H01S 5/323; H01S 5/0421; H01S 5/0206;
(Continued)

(56) References Cited

U.S. PATENT DOCUMENTS 4,691,321 A * 9/1987 Motegi ................. H01S 5/2231
372/45.01
6,396,863 B1 * 5/2002 Fukunaga .............. B82Y 20/00
372/46.01
(Continued)

FOREIGN PATENT DOCUMENTS

JP 2015-170750 A 9/2015

OTHER PUBLICATIONS

International Search Report; Written Opinion; and Notification of Transmittal of the International Search Report and the Written Opinion of the International Searching Authority, or the Declaration issued in PCT/JP2017/019908; dated Aug. 8, 2017.

*Primary Examiner* — Andrew Jordan
(74) *Attorney, Agent, or Firm* — Studebaker & Brackett PC

(57) ABSTRACT

A semiconductor device according to the present invention includes a substrate, a semiconductor laser that is provided on an upper surface of the substrate and emits laser light, a waveguide having a first conductive layer provided on the upper surface of the substrate, and a waveguide layer that is provided on the first conductive layer and guides the laser light and an embedment layer provided on the upper surface of the substrate and surrounding the semiconductor laser and the waveguide, wherein on both sides of an end part, of the waveguide, which is connected to the semiconductor laser, an exposed part is provided in which the substrate is exposed from the embedment layer by the embedment layer separated in a waveguide direction of the waveguide, and in the end part, a separation region is provided in which the first conductive layer is separated in the waveguide direction.

10 Claims, 6 Drawing Sheets

(51) Int. Cl.
  *G02B 6/132* (2006.01)
  *G02B 6/136* (2006.01)
  *H01S 5/02* (2006.01)
  *H01S 5/042* (2006.01)
  *H01S 5/323* (2006.01)
  *H01S 5/40* (2006.01)

(52) U.S. Cl.
  CPC ............ *G02B 6/136* (2013.01); *H01S 5/0206* (2013.01); *H01S 5/0421* (2013.01); *H01S 5/323* (2013.01); *H01S 5/4012* (2013.01); *H01S 5/4087* (2013.01); *G02B 2006/12121* (2013.01); *G02B 2006/12173* (2013.01)

(58) Field of Classification Search
  CPC .... G02B 6/136; G02B 6/132; G02B 6/12004; G02B 2006/12173; G02B 2006/12121
  See application file for complete search history.

(56) References Cited

U.S. PATENT DOCUMENTS

| | | | |
|---|---|---|---|
| 10,261,390 B2* | 4/2019 | Kim | ........................ G02F 1/2955 |
| 2018/0059507 A1* | 3/2018 | Kim | ........................ G02F 1/2955 |
| 2020/0091675 A1* | 3/2020 | Kawasaki | ............. H01S 5/0421 |

* cited by examiner

SEMICONDUCTOR LASER WITH WAVEGUIDE FLANKED BY CONDUCTIVE LAYERS

FIELD

The present invention relates to a semiconductor device and a method for manufacturing a semiconductor device.

BACKGROUND

Patent Literature 1 discloses an optical semiconductor device. In this optical semiconductor device, a plurality of island-like semiconductor intermediate layers having a lower heat conductivity than the heat conductivity of a semiconductor substrate are provided between the semiconductor substrate and an optical waveguide layer. Gaps are formed between the plurality of island-like semiconductor intermediate layers. With this structure, temperature control of the optical waveguide layer is preferably performed.

CITATION LIST

Patent Literature

[PTL 1] JP 2015-170750 A

SUMMARY

Technical Problem

As illustrated in Patent Literature 1 by way of example, a layer with electric conductivity is generally provided between a waveguide layer which guides laser light and a substrate, in a waveguide coupled to a semiconductor laser. In this state, there can be a case where a current spreads into this layer with electric conductivity from a coupling part of the semiconductor laser and the waveguide in driving the semiconductor laser. This possibly causes characteristics of the semiconductor laser to be unstable, which increases power consumption thereof.

The present invention is devised in order to solve the aforementioned problems, and an object thereof is to obtain a semiconductor device and a method for manufacturing a semiconductor device capable of reducing power consumption.

Solution to Problem

A semiconductor device according to the present invention includes a substrate, a semiconductor laser that is provided on an upper surface of the substrate and emits laser light, a waveguide having a first conductive layer provided on the upper surface of the substrate, and a waveguide layer that is provided on the first conductive layer and guides the laser light and an embedment layer provided on the upper surface of the substrate and surrounding the semiconductor laser and the waveguide, wherein on both sides of an end part, of the waveguide, which is connected to the semiconductor laser, an exposed part is provided in which the substrate is exposed from the embedment layer by the embedment layer separated in a waveguide direction of the waveguide, and in the end part, a separation region is provided in which the first conductive layer is separated in the waveguide direction.

A method for manufacturing a semiconductor device according to the present invention includes a step of forming a semiconductor laser that emits laser light on an upper surface of a substrate, a step of forming a waveguide having a first conductive layer provided on the upper surface of the substrate, and a waveguide layer that is provided on the first conductive layer and guides the laser light, a step of forming an embedment layer surrounding the semiconductor laser and the waveguide on the upper surface of the substrate, a step of removing a part of the embedment layer on both sides of an end part, of the waveguide, connected to the semiconductor laser such that the embedment layer is separated in a waveguide direction of the waveguide to form an exposed part in which the substrate is exposed from the embedment layer, a step of covering the semiconductor laser, the waveguide, the embedment layer and the exposed part with an insulating film, an opening forming step of providing a plurality of openings on both sides of the waveguide in the insulating film to expose the exposed part and an etching step of performing wet etching using etching liquid having a higher etching rate for the first conductive layer than the waveguide layer with the insulating film being as a mask to remove a part of the first conductive layer in the end part, and providing a separation region in which the first conductive layer is separated in the waveguide direction in the end part.

Advantageous Effects of Invention

With the semiconductor device according to the invention of the present application, the first conductive layer provided between the substrate and the waveguide layer is separated in the waveguide direction in the end part, of the waveguide, that is on the semiconductor laser side. Therefore, a current can be suppressed from leaking to the waveguide side from the semiconductor laser through the first conductive layer. Accordingly, power consumption can be reduced.

With the method for manufacturing a semiconductor device according to the invention of the present application, the first conductive layer provided between the substrate and the waveguide layer is separated in the waveguide direction in the end part, of the waveguide, that is on the semiconductor laser side. Therefore, a current can be suppressed from leaking to the waveguide side from the semiconductor laser through the first conductive layer. Accordingly, power consumption can be reduced.

DESCRIPTION OF EMBODIMENTS

Figure 1:
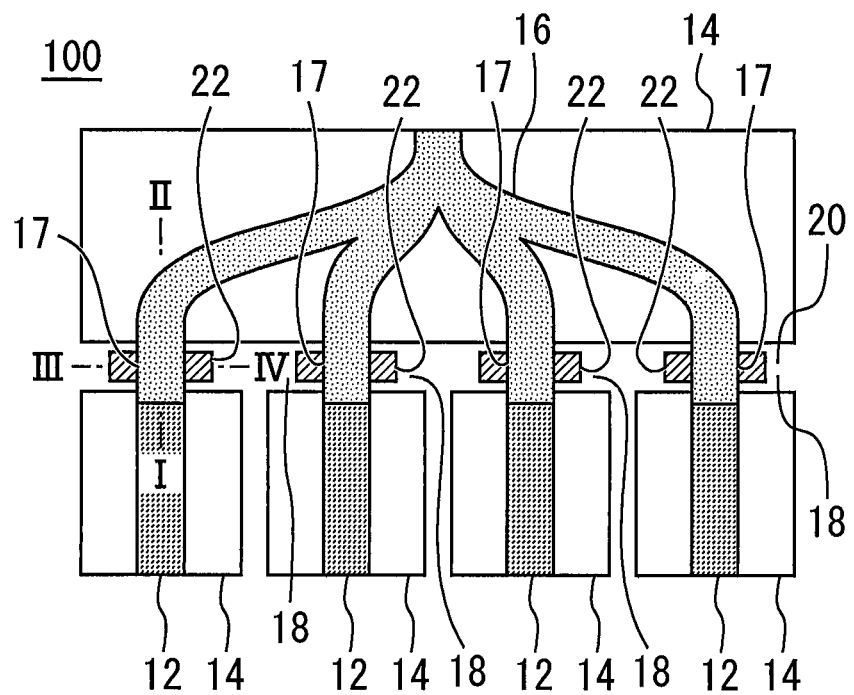
FIG. 1 is a plan view of a semiconductor device according to the first embodiment.

A semiconductor device and a method for manufacturing a semiconductor device according to an embodiment of the present invention are described with reference to drawings. Identical or corresponding constitutional elements are given the same reference numerals, and the repeated description of such constitutional elements may be omitted.

First Embodiment

FIG. 1 is a plan view of a semiconductor device 100 according to the first embodiment. The semiconductor device 100 includes a substrate 20. The substrate 20 is an insulative substrate. The substrate 20 is formed of i-InP. The semiconductor device 100 includes semiconductor lasers 12 which are provided on the upper surface of the substrate 20 and emit laser light. Moreover, the semiconductor device 100 includes a waveguide 16 which guides the laser light emitted from the semiconductor lasers 12. The semiconductor device 100 is an optical semiconductor device.

In the present embodiment, the semiconductor device 100 includes four semiconductor lasers 12. The waveguide 16 includes four input ends and one output end. The plurality of input ends of the waveguide 16 are individually connected to the plurality of semiconductor lasers 12. The waveguide 16 collects the plurality of beams of laser light emitted from the plurality of semiconductor lasers 12 into one to emit it from the output end. The plurality of semiconductor lasers 12 individually emit the beams of laser light with different wavelengths. The semiconductor device 100 is a four-wavelength integrated device which enables high speed optical communication. One or more semiconductor lasers 12 may be included in the semiconductor device 100.

The semiconductor device 100 includes an embedment layer 14 which is provided on the upper surface of the substrate 20 and surrounds the semiconductor lasers 12 and the waveguide 16. The lateral surfaces of the semiconductor lasers 12 and the lateral surfaces of the waveguide 16 are embedded in the embedment layer 14. The embedment layer 14 is a current blocking layer.

An exposed part 18 in which the substrate 20 is exposed from the embedment layer 14 is provided on both sides of end parts 17, of the waveguide 16, which are connected to the semiconductor lasers 12. The exposed part 18 is formed by the embedment layer 14 separated in the waveguide direction of the waveguide 16. Here, the waveguide direction is the direction in which the laser light is emitted from the semiconductor lasers 12. The exposed part 18 digs down to the substrate 20 in the embedment layer 14. The exposed part 18 exposes the lateral surfaces of the end parts 17 of the waveguide 16 from the embedment layer 14. The plurality of beams of laser light are collected into one through regions in which the embedment layer 14 is removed.

In the substrate 20, a groove 22 is provided right below the end part 17. The groove 22 is greater in width in a direction perpendicular to the waveguide direction than the waveguide 16. The groove 22 extends under the end part 17 from one of both sides of the waveguide 16 in the exposed part 18 to the other thereof.

Figure 2:
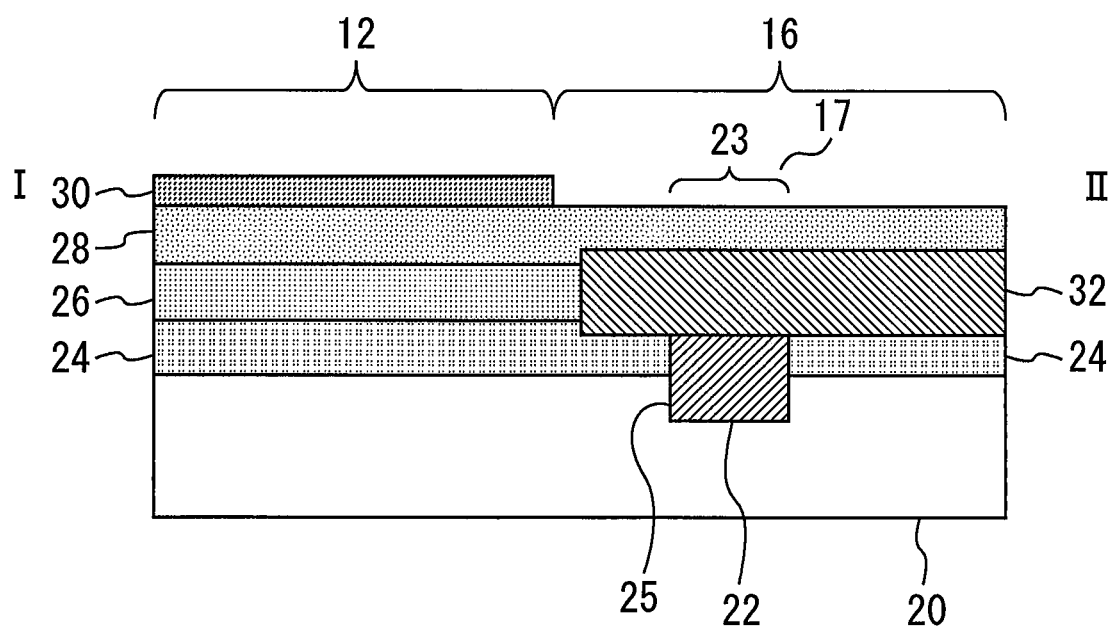
FIG. 2 is a cross-sectional view, of the semiconductor device, obtained by cutting FIG. 1 along the straight line I-II.

FIG. 2 is a cross-sectional view, of the semiconductor device 100, obtained by cutting FIG. 1 along the straight line I-II. A first conductive layer 24 is provided on the upper surface of the substrate 20. The first conductive layer 24 is an epitaxial growth layer. The first conductive layer 24 is formed of n-InP. A light-emitting layer 26 is provided on the first conductive layer 24. The light-emitting layer 26 emits laser light. The light-emitting layer 26 is formed of AlGaInAs. A waveguide layer 32 is provided on the first conductive layer 24 to be adjacent to the light-emitting layer 26. The waveguide layer 32 guides the laser light emitted from the light-emitting layer 26. The waveguide layer 32 is formed of InGaAsP.

A second conductive layer 28 is provided on the light-emitting layer 26 and the waveguide layer 32. The second conductive layer 28 is an epitaxial growth layer. The second conductive layer 28 is formed of p-InP. On the second conductive layer 28, an electrode formation epitaxial layer 30 is provided in an area above the light-emitting layer 26. The electrode formation epitaxial layer 30 is an epitaxial growth layer. The electrode formation epitaxial layer 30 is formed of P—InGaAs. The first conductive layer 24, the light-emitting layer 26, the second conductive layer 28 and the electrode formation epitaxial layer 30 constitute the semiconductor laser 12. Moreover, the first conductive layer 24, the waveguide layer 32 and the second conductive layer 28 constitute the waveguide 16.

A separation region 23 is provided in the end part 17, of the waveguide 16, connected to the semiconductor laser 12. In the separation region 23, the first conductive layer 24 is separated in the waveguide direction. In the separation region 23, the first conductive layer 24 is removed. Moreover, the groove 22 is provided right below the separation region 23. A hollow 25 is formed between the waveguide layer 32 and the substrate 20 in the separation region 23.

Figure 3:
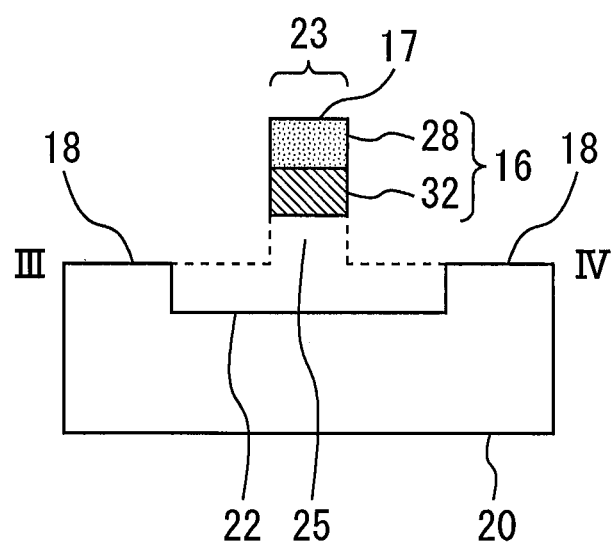
FIG. 3 is a cross-sectional view, of the semiconductor device, obtained by cutting FIG. 1 along the straight line III-IV.

FIG. 3 is a cross-sectional view, of the semiconductor device 100, obtained by cutting FIG. 1 along the straight line III-IV. The first conductive layer 24 is removed in the separation region 23. Moreover, the groove 22 is formed on the upper surface of the substrate 20 right below the separation region 23. Therefore, in the separation region 23 in sectional view, there is formed a structure in which the waveguide 16 floats above the substrate 20. Notably, FIG. 3 indicates a portion in which the first conductive layer 24 and the substrate 20 are removed by the broken lines.

Next, a method for manufacturing the semiconductor device 100 is described. First, the semiconductor lasers 12 are formed on the upper surface of the substrate 20. Moreover, the waveguide 16 is formed on the upper surface of the substrate 20. Next, the embedment layer 14 surrounding the semiconductor lasers 12 and the waveguide 16 is formed on the upper surface of the substrate 20.

Figure 4:
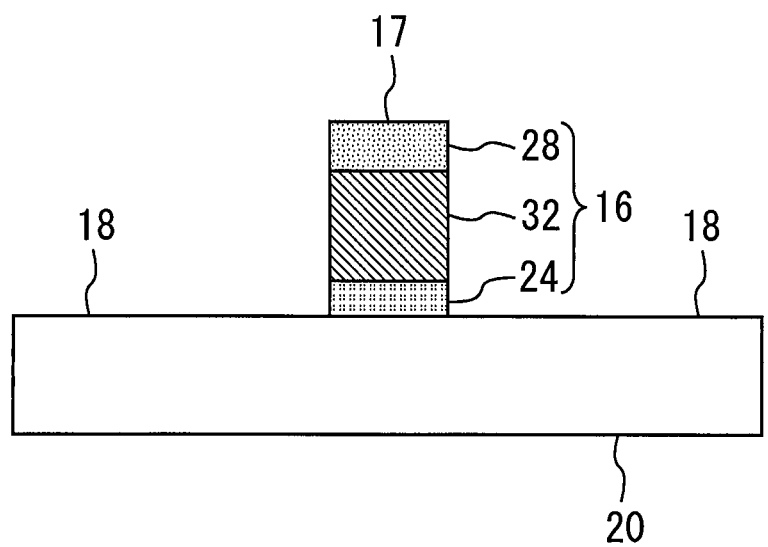
FIG. 4 is a cross-sectional view of the end part of the waveguide for illustrating a state where the parts of the embedment layer are removed.

Next, parts of the embedment layer 14 are removed on both sides of the end parts 17, of the waveguide 16, which are connected to the semiconductor lasers 12. FIG. 4 is a cross-sectional view of the end part 17 of the waveguide 16 for illustrating a state where the parts of the embedment layer 14 are removed. In this stage, the parts of the embedment layer 14 are removed such that the embedment layer 14 is separated in the waveguide direction of the waveguide 16. Moreover, the substrate 20 is exposed from the embedment layer 14 by removing the parts of the embedment layer 14. The parts in which the substrate 20 is exposed from the embedment layer 14 constitute the exposed part 18. Moreover, the parts of the embedment layer 14 are removed such that the lateral surfaces of the waveguide 16 are exposed. In coupling regions of the waveguide 16 and the semiconductor lasers 12, layers with electric conductivity other than the semiconductor lasers 12 and the waveguide 16 are removed by the embedment layer 14 removed.

Figure 5:
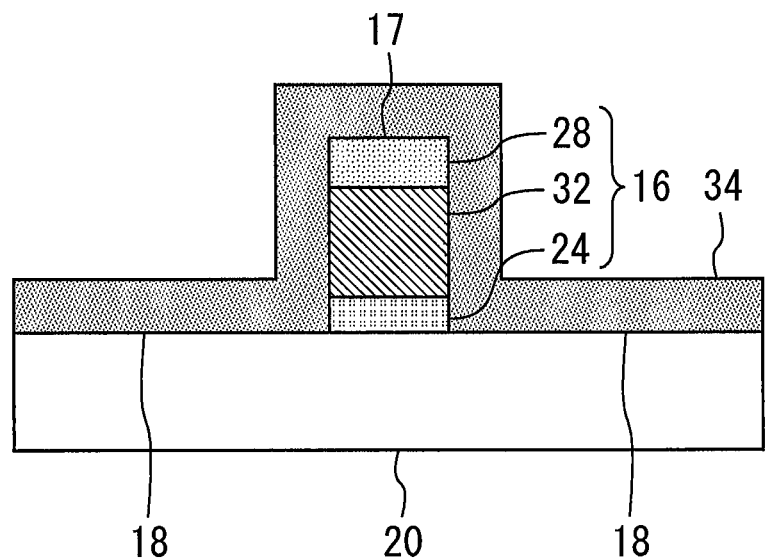
FIG. 5 is a cross-sectional view illustrating a state where the insulating film is formed.

Next, an insulating film 34 covers the semiconductor lasers 12, the waveguide 16, the embedment layer 14 and the exposed part 18. FIG. 5 is a cross-sectional view illustrating a state where the insulating film 34 is formed. The insulating film 34 is formed by a sputtering method or a P-CVD (Plasma Chemical Vapor Deposition) method, which have excellent coatability. Thereby, the insulating film 34 also covers the lateral surfaces, of the waveguide 16, that are exposed from the embedment layer 14.

Figure 6:
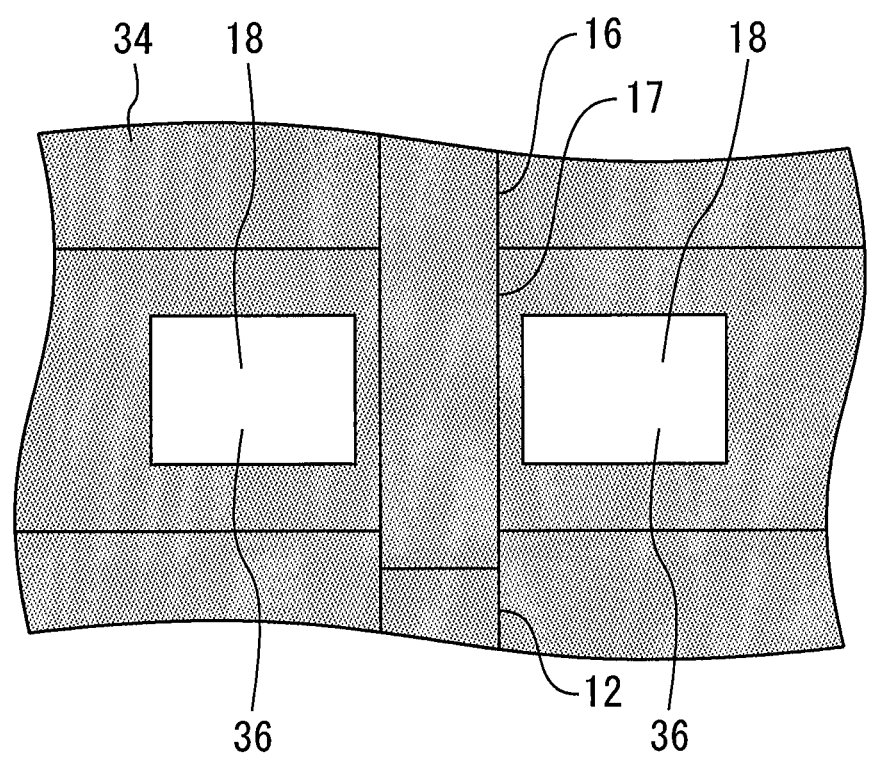
FIG. 6 is a plan view for explaining an opening forming step of the first embodiment.
Figure 7:
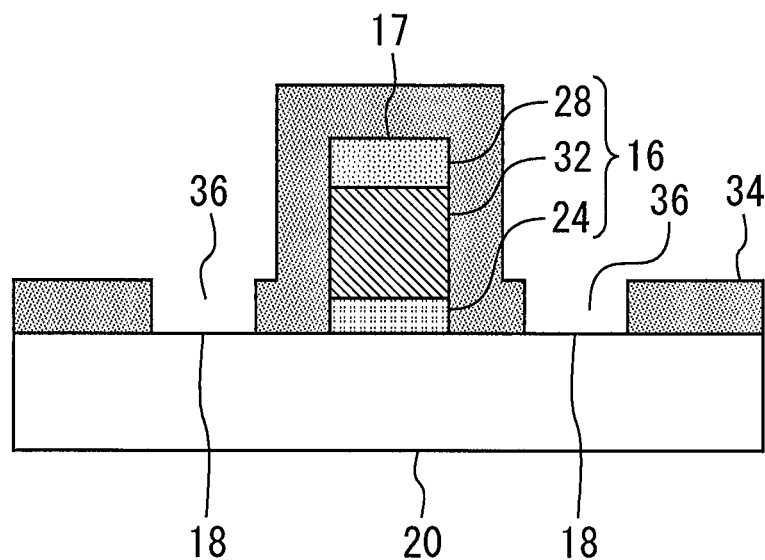
FIG. 7 is a cross-sectional view for explaining the opening forming step of the first embodiment.

Next, an opening forming step is performed. FIG. 6 is a plan view for explaining an opening forming step of the first embodiment. FIG. 7 is a cross-sectional view for explaining the opening forming step of the first embodiment. First, a photoresist is formed on the insulating film 34. Next, the photoresist is patterned. In this stage, openings are provided in the photoresist, for example, on both sides of the end part 17. Next, the insulating film is etched with the photoresist being as a mask. Thereby, a plurality of openings 36 are provided in the insulating film 34. The plurality of openings 36 are provided on both sides of the end part 17 of the waveguide 16. The exposed part 18 is exposed from the openings 36.

Figure 8:
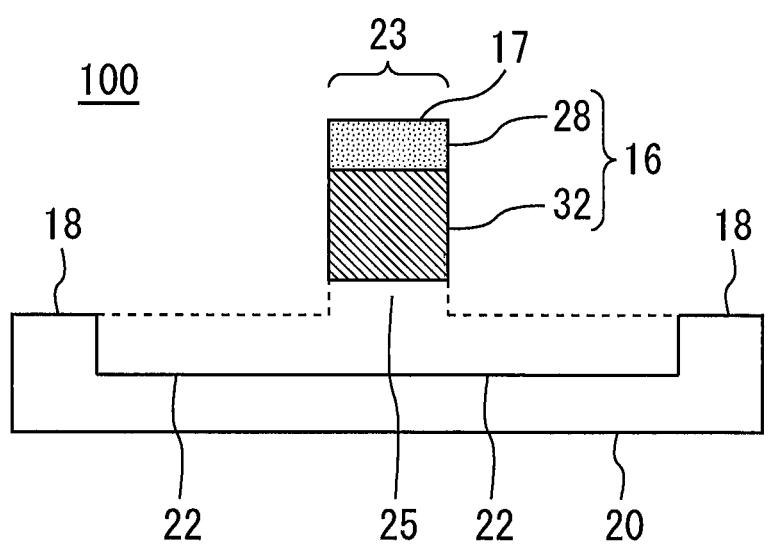
FIG. 8 is a cross-sectional view for explaining an etching step of the first embodiment.

Next, an etching step is performed. FIG. 8 is a cross-sectional view for explaining an etching step of the first embodiment. In the etching step, wet etching is performed with the insulating film 34 being as a mask. In this stage, etching liquid is used which has a higher etching rate for the first conductive layer 24 than for the waveguide layer 32. Moreover, the etching liquid has a higher etching rate for the substrate 20 than for the waveguide layer 32. To this end, HBr-based or HCl-based etching liquid can be used.

In the etching step, the substrate 20 is immersed in the etching liquid. Thereby, isotropic etching is performed. The etching liquid erodes the substrate 20 from the openings 36 to reach the first conductive layer 24. After that, the etching liquid erodes the first conductive layer 24 to reach the waveguide layer 32. The etching is stopped at the waveguide layer 32. According to the above, the hollow 25 is formed between the waveguide 16 and the substrate 20 in the end part 17. Notably, FIG. 8 indicates the portion removed by the etching by the broken lines. In the method for manufacturing the semiconductor device 100 according to the present embodiment, use of HBr-based or HCl-based etching liquid can selectively promote etching of InP layers out of InP layers and InGaAsP layers.

In the etching step, parts of the first conductive layer 24 are removed in the end parts 17 to provide the separation regions 23 in the end parts 17. Moreover, the grooves 22 are provided right below the separation regions 23 in the substrate 20. Each groove 22 extends right under the separation region 23 from one of both sides of the waveguide 16 in the exposed part 18 to the other thereof. In the separation region 23, the waveguide 16 is a hollow waveguide.

In the semiconductor device 100 according to the present embodiment, the embedment layer 14 is removed on both sides of the end parts 17 of the waveguide 16, and the embedment layer 14 is separated in the waveguide direction. Layers with electric conductivity are removed around the coupling parts of the semiconductor lasers 12 and the waveguide 16, and thereby, there can be suppressed the electric influence of the embedment layer 14 on waveguide of laser light. Therefore, a current can be suppressed from spreading into the embedment layer 14.

Moreover, a current is well conducted through the first conductive layer 24 provided right below the light-emitting layer 26 and the waveguide layer 32. In the present embodiment, the first conductive layer 24 is separated in the end parts 17 of the waveguide 16 in the waveguide direction. Accordingly, a current can be suppressed from leaking to the waveguide 16 side of the first conductive layer 24 from the coupling parts of the semiconductor lasers 12 and the waveguide 16. According to the above, in the present embodiment, characteristics of the semiconductor device 100 can be stabilized. Moreover, power consumption of the semiconductor device 100 can be reduced.

In the present embodiment, the semiconductor device 100 is supposed to be a four-wavelength integrated device. Not limited to this, the present embodiment can be applied to any structure in which a semiconductor laser and a waveguide are connected to each other. These modifications can be applied, as appropriate, to a semiconductor device and a method for manufacturing a semiconductor device according to the following embodiments. Note that the semiconductor device and the method for manufacturing a semiconductor device according to the following embodiments are similar to those of the first embodiment in many respects, and thus differences between the semiconductor device and the method for manufacturing a semiconductor device according to the following embodiments and those of the first embodiment will be mainly described below.

Second Embodiment

Figure 9:
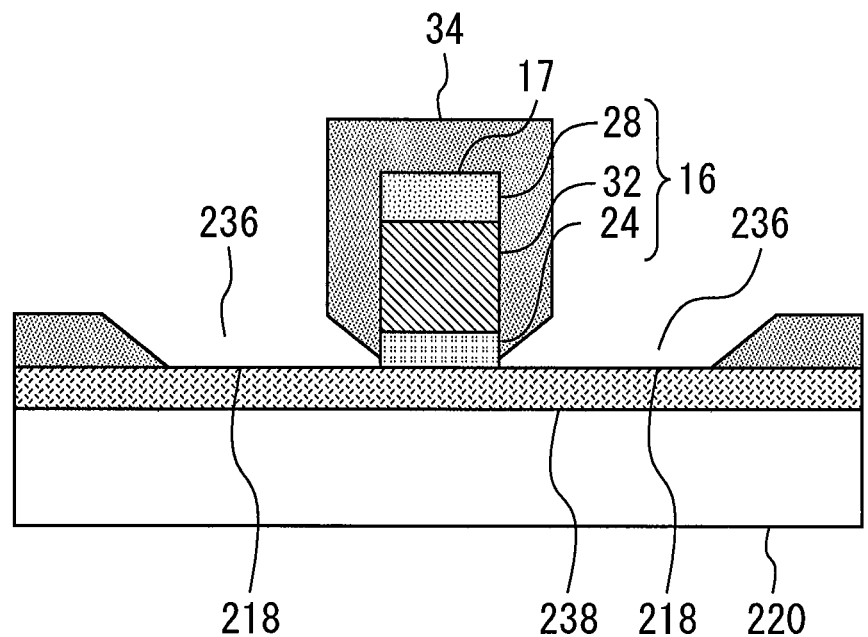
FIG. 9 is a cross-sectional view for explaining a method for manufacturing a semiconductor device of the second embodiment.

FIG. 9 is a cross-sectional view for explaining a method for manufacturing a semiconductor device 200 of the second embodiment. This embodiment is different from the first embodiment in the structure of a substrate 220. An etching stop layer 238 is provided on the upper surface side of the substrate 220. On the etching stop layer 238, the first conductive layer 24 is provided. The etching stop layer 238 is an insulative epitaxial growth layer. The etching stop layer 238 is formed on i-InGaAsP. Moreover, in an exposed part 218, the etching stop layer 238 is exposed from the embedment layer 14.

Next, a method for manufacturing the semiconductor device 200 according to the present embodiment is described. It is similar to that of the first embodiment in steps at and before formation of the insulating film 34. Next, an opening forming step is performed. In the opening forming step, a plurality of openings 236 are provided in the insulating film 34 on both sides of the end part 17 of the waveguide 16. The plurality of openings 236 are provided so as to expose the etching stop layer 238 and the first conductive layer 24. Herein, the first conductive layer 24 is exposed by removing portions, of the insulating film 34, which cover the lateral surfaces of the first conductive layer 24.

Figure 10:
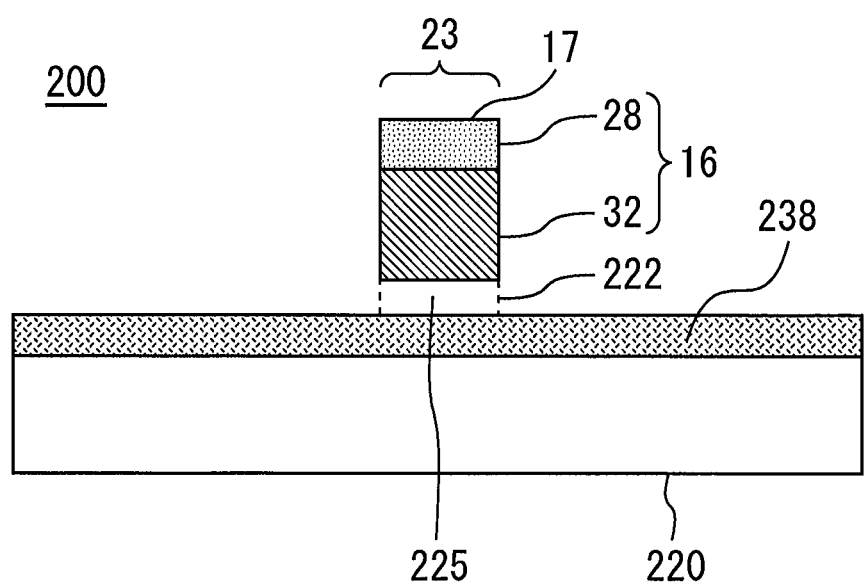
FIG. 10 is a cross-sectional view for explaining an etching step of the second embodiment.

Next, an etching step is performed. FIG. 10 is a cross-sectional view for explaining an etching step of the second embodiment. In the etching step, etching liquid is used which has a higher etching rate for the first conductive layer 24 than for the etching stop layer 238. Moreover, the etching liquid has a higher etching rate for the first conductive layer 24 than for the waveguide layer 32. In the etching step, for example, HBr-based etching liquid can be used. In the present embodiment, providing the etching stop layer 238 on the substrate 220 allows the etching liquid not to erode the substrate 220 but to erode the first conductive layer 24 from the openings 236. Similarly to the first embodiment, when the etching liquid reaches the waveguide layer 32, the etching is stopped thereat.

According to the above, the separation region 23 in which the first conductive layer 24 is separated in the waveguide direction is formed in the end part 17 of the waveguide 16. A hollow 225 is formed between the substrate 220 and the waveguide 16 right below the separation region 23. Notably, FIG. 10 indicates the portion removed by the etching by the broken lines.

In the present embodiment, only the first conductive layer 24 can be removed in the etching step. The substrate 220 is not eroded, and thereby, in the case where a coating film is provided on the semiconductor device 200 in a step afterward or the similar case, uniformity of such a coating film can be more improved than in the first embodiment. Moreover, strength of the semiconductor device 200 against external force can be more improved than in the first embodiment.

Third Embodiment

Figure 11:
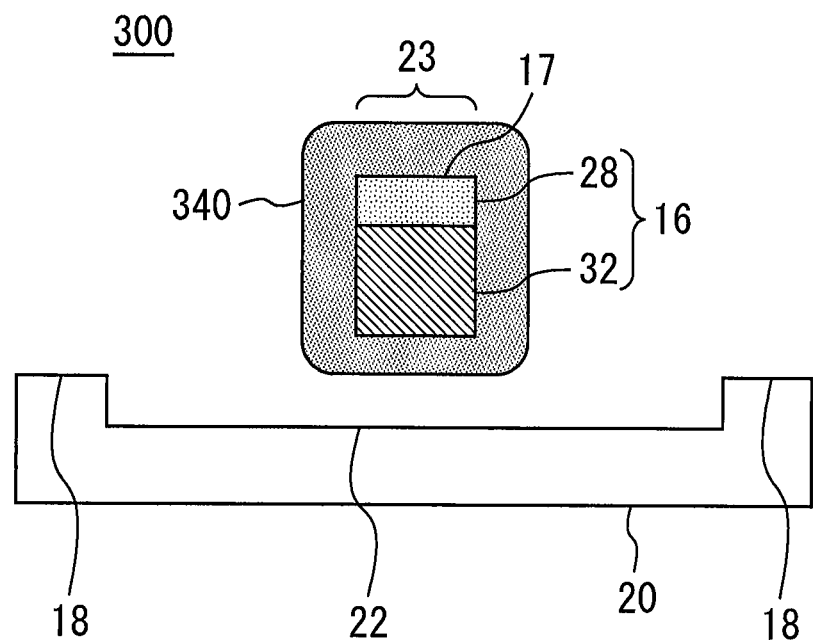
FIG. 11 is a cross-sectional view of a semiconductor device of the third embodiment.

FIG. 11 is a cross-sectional view of a semiconductor device 300 of the third embodiment. In the separation region 23 of the semiconductor device 300, the waveguide 16 is surrounded by a protective insulating film 340 in sectional view. In a method for manufacturing the semiconductor device 300 according to the present embodiment, after the separation region 23 is formed, the protective insulating film 340 is formed on the end part 17 of the waveguide 16 by a CVD (Chemical Vapor Deposition) film forming method. In the present embodiment, by using the CVD film forming method, which has excellent coatability, the waveguide 16 is surrounded by the protective insulating film 340 in the separation region 23. This affords a structure in which the protective insulating film 340 also covers the lateral surfaces and the rear surface of the waveguide 16. The rear surface of the waveguide 16 is the surface, of the waveguide 16, that faces the substrate 20.

In the present embodiment, by using a film formation method which has excellent coatability, the end part 17 of the waveguide 16 which is a hollow waveguide can be covered by the protective insulating film 340. Thereby, chemical resistance in steps afterward can be improved. Moreover, strength of the semiconductor device 300 against external force can be more improved than in the first embodiment. Moreover, by controlling the thickness or the refractive index of the protective insulating film 340, characteristics of waveguide of laser light can be stabilized.

Fourth Embodiment

Figure 12:
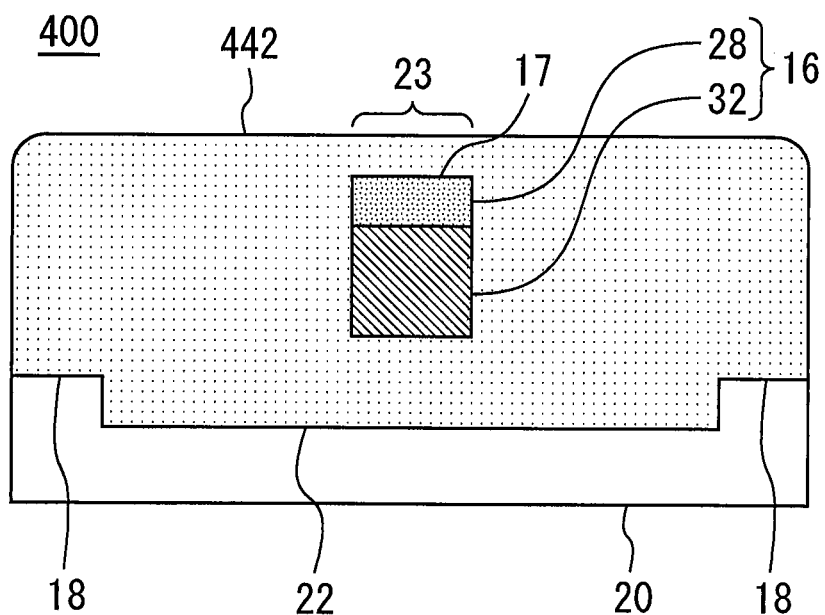
FIG. 12 is a cross-sectional view of a semiconductor device of the fourth embodiment.

FIG. 12 is a cross-sectional view of a semiconductor device 400 of the fourth embodiment. The semiconductor device 400 includes polyimide 442 for filling a gap between the waveguide layer 32 and the substrate 20 in the separation region 23. The polyimide 442 is provided so as to cover the semiconductor lasers 12, the waveguide 16, the embedment layer 14 and the exposed part 18. A method for manufacturing the semiconductor device 400 according to the present embodiment includes a step of applying the polyimide 442 onto the semiconductor lasers 12, the waveguide 16, the embedment layer 14 and the exposed part 18. Since the polyimide 442 is a coating film, the gap between the waveguide layer 32 and the substrate 20 is filled with the polyimide 442 in the separation region 23.

In the present embodiment, since the gap between the waveguide layer 32 and the substrate 20 is filled with a coating film, chemical resistance in steps afterward can be improved. Moreover, strength of the semiconductor device 400 against external force can be more improved than in the first embodiment. Moreover, by covering the waveguide 16 with the polyimide 442 that is low in refractive index, characteristics of waveguide of laser light can be stabilized. As a modification of the present embodiment, BCB (benzocyclobutene) may be used in place of the polyimide 442. Note that the technical features described in the above embodiments may be combined as appropriate.

REFERENCE SIGNS LIST 100,200,300,400 semiconductor device, 12 semiconductor lasers, 14 embedment layer, 16 waveguide, 17 end part, 18,218 exposed part, 20,220 substrate, 22 groove, 23 separation region, 24 first conductive layer, 32 waveguide layer, 34 insulating film, 36,236 opening, 238 etching stop layer, 340 protective insulating film, 442 polyimide

The invention claimed is:
1. A semiconductor device comprising:
   a substrate;
   a semiconductor laser that is provided on an upper surface of the substrate and emits laser light;
   a waveguide having a first conductive layer provided on the upper surface of the substrate, and a waveguide layer that is provided on the first conductive layer and guides the laser light; and
   an embedment layer provided on the upper surface of the substrate and surrounding the semiconductor laser and the waveguide, wherein
   on both sides of an end part, of the waveguide, which is connected to the semiconductor laser, an exposed part is provided in which the substrate is exposed from the embedment layer by the embedment layer separated in a waveguide direction of the waveguide, and
   in the end part, a separation region is provided in which the first conductive layer is separated in the waveguide direction.
2. The semiconductor device according to claim 1, wherein in the substrate, a groove greater in width in a direction perpendicular to the waveguide direction than the waveguide is provided right below the separation region.
3. The semiconductor device according to claim 1, wherein
   an etching stop layer is provided on the upper surface side of the substrate, and
   the etching stop layer is exposed from the embedment layer in the exposed part.
4. The semiconductor device according to claim 1, wherein the waveguide is surrounded by a protective insulating film in sectional view in the separation region.
5. The semiconductor device according to claim 1, comprising polyimide for filling a gap between the waveguide layer and the substrate in the separation region.
6. A method for manufacturing a semiconductor device comprising:
   a step of forming a semiconductor laser that emits laser light on an upper surface of a substrate;
   a step of forming a waveguide having a first conductive layer provided on the upper surface of the substrate, and a waveguide layer that is provided on the first conductive layer and guides the laser light;

a step of forming an embedment layer surrounding the semiconductor laser and the waveguide on the upper surface of the substrate;

a step of removing a part of the embedment layer on both sides of an end part, of the waveguide, connected to the semiconductor laser such that the embedment layer is separated in a waveguide direction of the waveguide to form an exposed part in which the substrate is exposed from the embedment layer;

a step of covering the semiconductor laser, the waveguide, the embedment layer and the exposed part with an insulating film;

an opening forming step of providing a plurality of openings on both sides of the waveguide in the insulating film to expose the exposed part; and an etching step of performing wet etching using etching liquid having a higher etching rate for the first conductive layer than the waveguide layer with the insulating film being as a mask to remove a part of the first conductive layer in the end part, and providing a separation region in which the first conductive layer is separated in the waveguide direction in the end part.

7. The method for manufacturing a semiconductor device according to claim 6, wherein the etching liquid has a higher etching rate for the substrate than the waveguide layer, and in the etching step, a groove greater in width in a direction perpendicular to the waveguide direction than the waveguide is provided in the substrate right below the separation region.

8. The method for manufacturing a semiconductor device according to claim 6, wherein an etching stop layer is provided on the upper surface side of the substrate, in the opening forming step, the plurality of openings are provided so as to expose the etching stop layer and the first conductive layer, and the etching liquid has a higher etching rate for the first conductive layer than the etching stop layer.

9. The method for manufacturing a semiconductor device according to claim 6, comprising a step of forming a protective insulating film by a CVD film forming method such that the waveguide is surrounded by the protective insulating film in sectional view in the separation region.

10. The method for manufacturing a semiconductor device according to claim 6, comprising a step of filling a gap between the waveguide layer and the substrate with polyimide in the separation region.

* * * * *